(12) United States Patent
Brück et al.

(10) Patent No.: US 8,881,513 B2
(45) Date of Patent: Nov. 11, 2014

(54) DEVICE FOR PRODUCING ELECTRICAL ENERGY FROM EXHAUST GAS HEAT AND MOTOR VEHICLE HAVING THE DEVICE

(75) Inventors: Rolf Brück, Bergisch Gladbach (DE); Jan Hodgson, Troisdorf (DE); Sigrid Limbeck, Much (DE); Axel Schatz, Köln (DE)

(73) Assignee: EMITEC Gesellschaft fuer Emissionstechnologie mbH, Lohmar (DE)

( * ) Notice: Subject to any disclaimer, the term of this patent is extended or adjusted under 35 U.S.C. 154(b) by 780 days.

(21) Appl. No.: 12/947,097

(22) Filed: Nov. 16, 2010

(65) Prior Publication Data

US 2011/0120106 A1 May 26, 2011

Related U.S. Application Data

(63) Continuation of application No. PCT/EP2009/055744, filed on May 13, 2009.

(30) Foreign Application Priority Data

May 16, 2008 (DE) .................. 10 2008 023 937

(51) Int. Cl.

| | | |
|---|---|---|
| *F01N 3/02* | (2006.01) | |
| *F01N 3/00* | (2006.01) | |
| *F01N 1/00* | (2006.01) | |
| *F01N 3/28* | (2006.01) | |
| *H01L 35/32* | (2006.01) | |
| *F01N 5/02* | (2006.01) | |
| *H01L 35/30* | (2006.01) | |
| *F01N 3/20* | (2006.01) | |

(52) U.S. Cl.
CPC .............. *F01N 3/2889* (2013.01); *H01L 35/32* (2013.01); *F01N 5/025* (2013.01); *H01L 35/30* (2013.01); *F01N 2410/02* (2013.01); *Y02T 10/16* (2013.01); *F01N 3/2053* (2013.01)
USPC ................................ 60/320; 60/298; 60/324

(58) Field of Classification Search
USPC .......................................... 60/298, 320, 324
See application file for complete search history.

(56) References Cited

U.S. PATENT DOCUMENTS

| | | | |
|---|---|---|---|
| 7,150,147 B2 | 12/2006 | Murata | |
| 7,275,367 B2 * | 10/2007 | Tamura et al. ................. | 60/324 |
| 7,467,513 B2 | 12/2008 | Sasaki et al. | |
| 7,523,607 B2 * | 4/2009 | Sullivan ......................... | 60/320 |
| 2005/0172993 A1 | 8/2005 | Shimoji et al. | |
| 2007/0045044 A1 | 3/2007 | Sullivan | |

FOREIGN PATENT DOCUMENTS

| | | |
|---|---|---|
| DE | 102006057662 A1 | 6/2008 |
| EP | 1522685 A1 | 4/2005 |
| JP | S622388 U | 1/1987 |

(Continued)

OTHER PUBLICATIONS

International Search Report of PCT/EP2009/055744, Dated Aug. 25, 2008.

*Primary Examiner* — Thomas Denion
*Assistant Examiner* — Diem Tran
(74) *Attorney, Agent, or Firm* — Laurence A. Greenberg; Werner H. Stemer; Ralph E. Locher (57) ABSTRACT

A device for producing electrical energy from the exhaust gas of an internal combustion engine, includes a generator with an exhaust gas inlet connection, an exhaust gas outlet connection and at least one heat exchange section therebetween. At least one flow diversion and/or flow division is provided between the exhaust gas inlet connection and the heat exchange section. The heat exchange section has a plurality of flow paths perpendicular to the exhaust gas inlet connection, to be assigned to a plurality of heat exchange units. At least a portion of the heat exchange assembly has at least one thermoelectric element and a cooling device. The at least one thermoelectric element is captively connected to the cooling device. A motor vehicle having the device is also provided.

14 Claims, 5 Drawing Sheets

(56) References Cited

FOREIGN PATENT DOCUMENTS

| JP | 10234194 A | 9/1998 |
| JP | 11036981 A | 2/1999 |
| JP | 2004208476 A | 7/2004 |
| JP | 2005223131 A | 8/2005 |
| JP | 2006512535 A | 4/2006 |
| WO | 2005/0509139 A1 | 7/2004 |
| WO | 2007026432 A1 | 3/2007 |

* cited by examiner

DEVICE FOR PRODUCING ELECTRICAL ENERGY FROM EXHAUST GAS HEAT AND MOTOR VEHICLE HAVING THE DEVICE

CROSS-REFERENCE TO RELATED APPLICATION

This is a continuation, under 35 U.S.C. §120, of copending International Application No. PCT/EP2009/055744, filed May 13, 2009, which designated the United States; this application also claims the priority, under 35 U.S.C. §119, of German Patent Application DE 10 2008 023 937.2, filed May 16, 2008; the prior applications are herewith incorporated by reference in their entirety.

BACKGROUND OF THE INVENTION

Field of the Invention

The present invention relates to a device for producing electrical energy from the exhaust gas of an internal combustion engine through the use of a generator. The invention relates, in particular, to a generator for converting the thermal energy of an exhaust gas into electrical energy, that is to a so-called thermoelectric generator. The invention also relates to a motor vehicle having the device.

Exhaust gas from an engine of a motor vehicle possesses thermal energy, which is to be converted into electrical energy through the use of a thermoelectric generator, in order to charge a battery or some other energy storage device, for example, or to deliver the necessary energy directly to electrical consumers. More energy is thereby available for the operation of the motor vehicle.

Such a thermoelectric generator generally includes a plurality of thermoelectric converter elements. Thermoelectric materials are of a type capable of efficiently converting thermal energy into electrical energy (Seebeck effect) and vice-versa (Peltier effect). The "Seebeck effect" is based on the phenomenon in which thermal energy is converted into electrical energy and is used to produce thermoelectric energy. The "Peltier effect" is the opposite of the Seebeck effect and is a phenomenon which is accompanied by heat absorption, and is caused in the context of a current flow through different materials. The Peltier effect has already been proposed as a method of thermoelectric cooling, for example.

Such thermoelectric converter elements preferably include a number of thermoelectric elements, which are positioned between a so-called "warm side" and a so-called "cold side." Thermoelectric elements include at least two semiconductor blocks (p-type and n-type), for example, which are alternately connected to electrically conductive bridges on their upper and lower sides (respectively facing the "hot side" and "cold side"). Ceramic plates or coatings and/or similar materials serve for insulation of the metal bridges and are therefore preferably disposed between the metal bridges. If a temperature gradient is provided on both sides of the semiconductor blocks, a voltage potential is formed. In that case, heat is absorbed at one contact point ("warm side"), with the electrons passing from the one side to the higher-energy conduction band of the following block. On the other side, the electrons can now release energy to return to the other side at the lower energy level ("cold side"). A flow of current can therefore occur given a corresponding temperature gradient.

Attempts have already been made to provide corresponding thermoelectric generators for use in motor vehicles, particularly in passenger motor vehicles. They were generally very expensive to manufacture, however, and characterized by a relatively low efficiency. They have therefore as yet not been suitable for mass production.

SUMMARY OF THE INVENTION

It is accordingly an object of the invention to provide a device for producing electrical energy from exhaust gas heat and a motor vehicle having the device, which overcome the hereinafore-mentioned disadvantages and at least partially solve the highlighted problems of the heretofore-known devices and vehicles of this general type. In particular, the intention is to specify a thermoelectric generator, which affords improved efficiency in converting available thermal energy into electrical energy and which, in particular, is also a match for the variable stresses occurring in the exhaust system of mobile internal combustion engines.

With the foregoing and other objects in view there is provided, in accordance with the invention, a device for producing electrical energy from the exhaust gas of an internal combustion engine. The device comprises a generator having an exhaust gas inlet connection, an exhaust gas outlet connection and at least one heat exchange section between the exhaust gas inlet connection and the exhaust gas outlet connection. The heat exchange section includes at least one heat exchange unit having at least one thermoelectric element and a cooling device. The at least one thermoelectric element is captively connected to the cooling device.

In accordance with another feature of the invention, at least one flow diversion or diverter is provided between the exhaust gas inlet connection and the heat exchange section.

In accordance with a further feature of the invention, at least one flow division or divider is provided between the exhaust gas inlet connection and the heat exchange section.

In accordance with an added feature of the invention, the heat exchange section is constructed with a plurality of flow paths transversely to the exhaust gas inlet connection, which can be assigned to multiple heat exchange units, and at least some of the heat exchange units are constructed with at least one thermoelectric element and a cooling device.

This device is, in particular, a so-called thermoelectric generator. The exhaust gas inlet connection and the exhaust gas outlet connection may be constructed, in particular, as part of an exhaust system or an exhaust pipe. It is also possible, however, to provide multiple exhaust gas inlet connections and/or multiple exhaust gas outlet connections. The heat exchange section forms the core of the generator. This relates, in particular, to a part of the exhaust gas flow path through the generator, in which the exhaust gas gives off thermal energy to the heat exchange units. It is also possible for the exhaust gas to flow through multiple such heat exchange sections on its path through the generator, although the variant in which the exhaust gas flows through only one (continuous) heat exchange section is preferred.

In accordance with an additional feature of the invention, before entering the heat exchange section, the exhaust gas is, in particular, diverted and divided. This means, for example, that the exhaust gas flows through the exhaust line and the exhaust gas inlet connection and/or the exhaust gas outlet connection with a main direction of flow, but that a (complete) diversion of the exhaust gas is necessary for it to pass through the heat exchange section. It is preferable in this case for a diversion to occur obliquely or transversely to the main direction of flow, so that the entire exhaust gas flow is distributed in a circumferential direction. In the process, exhaust gas partial flows are formed which, in particular, follow different, in part even opposite directions of flow. A division of the exhaust gas flow into flow paths and, in particular, small channels is then brought about in order to afford the maximum possible contact areas for the exchange of heat. Flow paths may form directed and/or undirected passages for the exhaust gas, for example due to a regular and/or irregular division of the exhaust gas in the heat exchange section, with it generally being possible to (repeatedly) remix these exhaust gas partial flows with one another inside the heat exchange section. Such flow paths may be formed, in particular, by webs, studs or the like introduced into a gap. The channels are preferably distinctly separated from one another (for example by a continuous channel wall). In the case of flow paths and/or channels it may also be possible in specific instances, however, for the flow paths or channels to communicate with one another through connecting channels and/or openings. The flow paths or channels preferably number significantly more than 20, for example at least 50 or even at least 100 channels. The channels thereby have an opening cross section which is significantly reduced as compared to that of the exhaust gas inlet connection, so that a significantly enlarged heat exchange area, formed by the walls of the channels, is available.

In accordance with yet another feature of the invention, one or two heat exchange units with the thermoelectric elements and the cooling device are preferably disposed adjacent the flow paths. It may be preferable for the channels to be contiguous with the heat exchange units, that is to be in thermally conductive contact. In this case, the thermoelectric elements are preferably disposed along the channels, with the positioning of at least one thermoelectric element over the length of each flow path in the heat exchange section being especially preferred. The cooling device is disposed on the side of the thermoelectric elements remote from the flow paths. At the same time, the thermoelectric elements are captively connected to the cooling device. This means, in particular, that the thermoelectric elements are connected by a cohesive material connection or joint only to the cooling device and to some of the heat exchange units. The thermally conductive contact to the flow paths therefore, in particular, ensues only through a contiguous contact without any materially cohesive connection. In this context "captively" is intended to signify that a relative movement of the thermoelectric elements in relation to the cooling device is not possible (without dismantling) while the device is in operation, that is to say the thermoelectric elements are welded, soldered, brazed, bonded, anchored, screwed or clamped or securely fixed in some other way to the cooling device and the heat exchange unit.

In accordance with yet a further preferred feature of the invention, the exhaust gas inlet connection and the exhaust gas outlet connection are disposed opposite one another and the heat exchange units are disposed radially thereto. The exhaust gas inlet connection and exhaust gas outlet connection may thereby be integrated into a rectilinear, tubular exhaust line, for example. The heat exchange units are disposed radially around and perpendicularly to the exhaust line, so that the exhaust gas for producing electrical energy has to be diverted radially out of the main direction of flow, passes through the heat exchange section and then has again to be diverted once or repeatedly in order to flow back out through the exhaust gas outlet connection in the main direction of flow. Not only does this afford an especially compact construction, but the diversion increases a turbulent flow of the exhaust gas, so that in the succeeding heat exchange section an especially close contact is achieved between the walls of the channels, thereby ensuring a good heat transfer to the thermoelectric elements.

In accordance with yet an added feature of the invention, the heat exchange units and the cooling device are moreover advantageously formed with plate elements, on which at least one thermoelectric element is positioned. The cooling channels, through which a coolant is ducted or channeled, for example, can thus be formed between two superimposed plates. The cooling device and the heat exchange units are thereby relatively stable and robust, so that, in particular, any escape of coolant is prevented. This means, however, that the plate elements also afford scope for the attachment of the thermoelectric elements, which are preferably formed on a side of a plate element remote from the cooling device. The thermoelectric element is thereby disposed on the surface of a plate element, for example, on which the channels for the exhaust gas flow are then also disposed. The plate elements may be provided as modules and put together in the required form for ease of assembly. This represents a relatively cost-effective way of manufacturing such a thermoelectric generator.

In accordance with yet an additional feature of the invention, in this respect it is particularly advantageous for such a plate element to be constructed with an internal cooling device and thermoelectric elements on both sides facing the adjacent flow paths. The internal cooling device may be formed by milled or bored or otherwise manufactured cooling channels, with it being possible (but not preferable) to incorporate an additional material into the channels where necessary. It is advantageous, however, for the plate elements themselves to be formed from highly thermally conductive materials, so as to ensure an optimum transfer of the thermal energy produced from the exhaust gas to the heat exchange units and hence into the thermoelectric elements. In addition, these plate elements afford scope for a stable and protected configuration of the electrical leads to the thermoelectric elements.

In accordance with again another feature of the invention, it is also proposed in this context to form the plate element with a metal foil, which is provided with at least one thermoelectric element and is covered by a protective layer. In this case, the metal foil may have a structure so that a stack of at least two metal foils forms channels between them, in particular for the coolant. The plate element thereby has a low thermal mass and is very light. A protective layer, which, in particular, prevents exhaust gas on the upper side from coming into contact with the covered thermoelectric element, moreover provides for a captive connection between the thermoelectric element and the metal foil. The protective layer may take the form of a coating and/or a separate component (such as a further metal foil, for example).

In accordance with again a further feature of the invention, the channels produced by the stacking of such plate elements and through which the exhaust gas flows may also be produced by structured metal foils. In this case, multiple metal foils may be disposed one on top of another, so that channels can also be provided which are not disposed adjacent thermoelectric elements.

In accordance with again an added feature of the invention, the heat exchange unit is embodied as a tubular element. The tubular element is constructed to carry an internal flow. The tube interior in this case is used, in particular, as a cooling device and has a liquid or gaseous cooling medium flowing through it. At least one thermoelectric element, which is captively connected to the tubular element, is formed on or against the tube wall of the tubular element. The heat exchange unit formed by the tubular element may therefore have a cooling medium flowing around it internally and an exhaust gas flowing around it externally.

In accordance with again an additional feature of the invention, in this case, the tubular element may have a circular or an angular cross section. The configuration of a plurality of tubular elements produces the channels between the heat exchange units already described with regard to the plate elements.

In accordance with still another feature of the invention, compensators for relative movements of the heat exchange units are provided in the heat exchange section. This means, in particular, that in the heat exchange section measures are provided, which where necessary also permit a relative movement of the components of the heat exchange section, that is to say, for example, a (minimal) movement of the channels carrying exhaust gas in relation to the heat exchange units, particularly in the main direction of flow. This need not apply for all heat exchange units. As a rule one compensator should be sufficient for all heat exchange units. Such a compensator may be achieved, for example, by elastically deformable, possibly pre-stressed sheet metal parts. Components, particularly those which (partially) define the flow paths, such as corrugated metal foils, for example, serve as compensators. Additional compensators, for example, may furthermore be provided on the end faces of the heat exchange section (likewise having (corrugated) metal foils, for example, which are disposed parallel to the plate elements and which are not in contact with exhaust gas).

In accordance with still a further feature of the invention, the generator is constructed with a catalytic converter section, which is disposed at least partially upstream of the heat exchange section. It is especially preferred in this case if the exhaust gas, which is diverted into the heat exchange section, first flows through the catalytic converter section before reaching the heat exchange section. The exhaust gas most preferably flows in opposite directions through the catalytic converter section and the heat exchange section. In the catalytic converter section a radial honeycomb structure is preferably provided, which is coated with washcoat and an oxidation catalyst (preferably platinum). As a result of the catalytic conversion of exhaust gas constituents an exothermic reaction, which increases the thermal energy in the exhaust gas, is set up in the catalytic converter section. This now "preheated" exhaust gas then serves for generating a larger quantity of thermoelectric energy. The catalytic converter section may, if necessary, be constructed with various coatings and/or catalysts. It is also possible to vary the construction of the catalytic converter section in terms of the area of contact and/or the delivery of exhaust gas, in order to specifically regulate the temperature increase. In particular, at least partial areas of the channels and walls of the further areas of the generator through which exhaust gas flows, in particular at least partial areas of the channels of the heat exchange section, may also be coated with washcoat and an oxidation catalyst. The areas of the channels directly contiguous with a thermoelectric element in this case are preferably not provided with such a coating, since this may have an adverse effect upon the thermal conductivity of the flow paths to the thermoelectric elements.

In accordance with still an added feature of the invention, the flow diversion is a baffle structure positioned in the exhaust gas inlet connection. This is preferably a baffle structure positioned centrally in the exhaust gas inlet connection. The baffle structure may be in the nature of a cone, for example. Static mixers and the like may also be used. It is possibly advantageous to vary the angle and/or the axial position of the baffle structure in the exhaust gas inlet connection.

In accordance with still an additional feature of the invention, alternatively and/or additionally, a self-regulating baffle structure may also be provided, such as a structure which assumes a different position or attitude in the exhaust gas inlet connection at different temperatures. A bimetal, which is disposed so that the exhaust gas flows at least partially around it, is particularly suitable for this purpose. A bimetal (also a thermostatic bimetal) is, in particular, a metal strip composed of two layers of different material, which are connected together by a cohesive material and/or form-locking connection or joint. Characteristic of these strips is the variation in shape in response to a temperature change. This expresses itself as bending and is caused by the different coefficient of thermal expansion of the metals being used. A form-locking connection is one which connects two elements together due to the shape of the elements themselves, as opposed to a force-locking connection, which locks the elements together by force external to the elements.

In addition such a bimetal, which is disposed so that the exhaust gas flows at least partially around it, can also be used to control the operation of the device and/or constituent components of the device. For example, the bimetal may be used as a temperature sensor, so that the baffle structure is actuated as necessary as a function of the deformation of the bimetal, for example.

In accordance with another feature of the invention, at least one adjustable flow connection is provided from the exhaust gas inlet connection to the exhaust gas outlet connection, so that exhaust gas can flow past at least a part of the heat exchange section. This adjustable flow connection, a so-called bypass, which represents a direct connection from the exhaust gas inlet connection to the exhaust gas outlet connection, most preferably has the same flow cross section. This flow connection most preferably allows all of the exhaust gas to bypass the entire heat exchange section. This opens up the possibility, for example, of ducting or channeling the exhaust gas through the heat exchange section and producing thermoelectric energy only in specific load cycles and/or operating phases of the engine. Should thermal energy be needed for the downstream exhaust gas treatment components, for example, the adjustable flow connection can be used to prevent a premature dissipation of the heat needed later. The term "adjustable" is intended to signify that the extent to which the flow connection is used by the exhaust gas can be controlled. In principle, known exhaust flaps, valves or the like may be entertained for this purpose.

In accordance with a further feature of the invention, the at least one adjustable flow connection is most preferably a spring-loaded and pivoted flap on the inlet of the flow connection. This means, in particular, that the flap is disposed so that a spring or some other mechanism regularly adjusts the position of the flap, so that the flow connection is closed, that is to say in this case no exhaust gas, or only very little exhaust gas, can pass through. In specifically predefined situations, the flap can be actively pivoted by an adjusting mechanism, so that exhaust gas can flow through the inlet of the flow connection and can thereby flow directly to the exhaust gas outlet connection. It is also possible, however, for the flap to be spring-loaded in such a way that it is pivoted as a function of the exhaust gas back-pressure. This means, in other words, that at particularly high exhaust gas flow rates, the flap automatically opens wider. This makes it possible, for example, to avoid overheating of the thermoelectric generator and/or an excessive pressure loss for the engine output needed in these phases. This self-regulating mechanism is particularly simple and ensures durable operation of the device.

In accordance with an added feature of the invention, in addition, an auxiliary cooling or cooling device may also be provided for at least a part of the heat exchange section. This means, for example, that a second cooling circuit can be activated according to demand. The auxiliary cooling is most preferably a reversing circuit of the thermoelectric elements, so that these act as Peltier elements. This then allows them to cool the heat exchange section or to cool themselves, should excessively hot exhaust gas flow through the thermoelectric generator.

With the objects of the invention in view, there is concomitantly provided a motor vehicle, in particular a passenger motor vehicle, comprising the device according to the invention.

Other features which are considered as characteristic for the invention are set forth in the appended claims, noting that the features individually cited in the claims may be combined with one another in any technologically suitable manner and set forth further embodiments of the invention.

Although the invention is illustrated and described herein as embodied in a device for producing electrical energy from exhaust gas heat and a motor vehicle having the device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
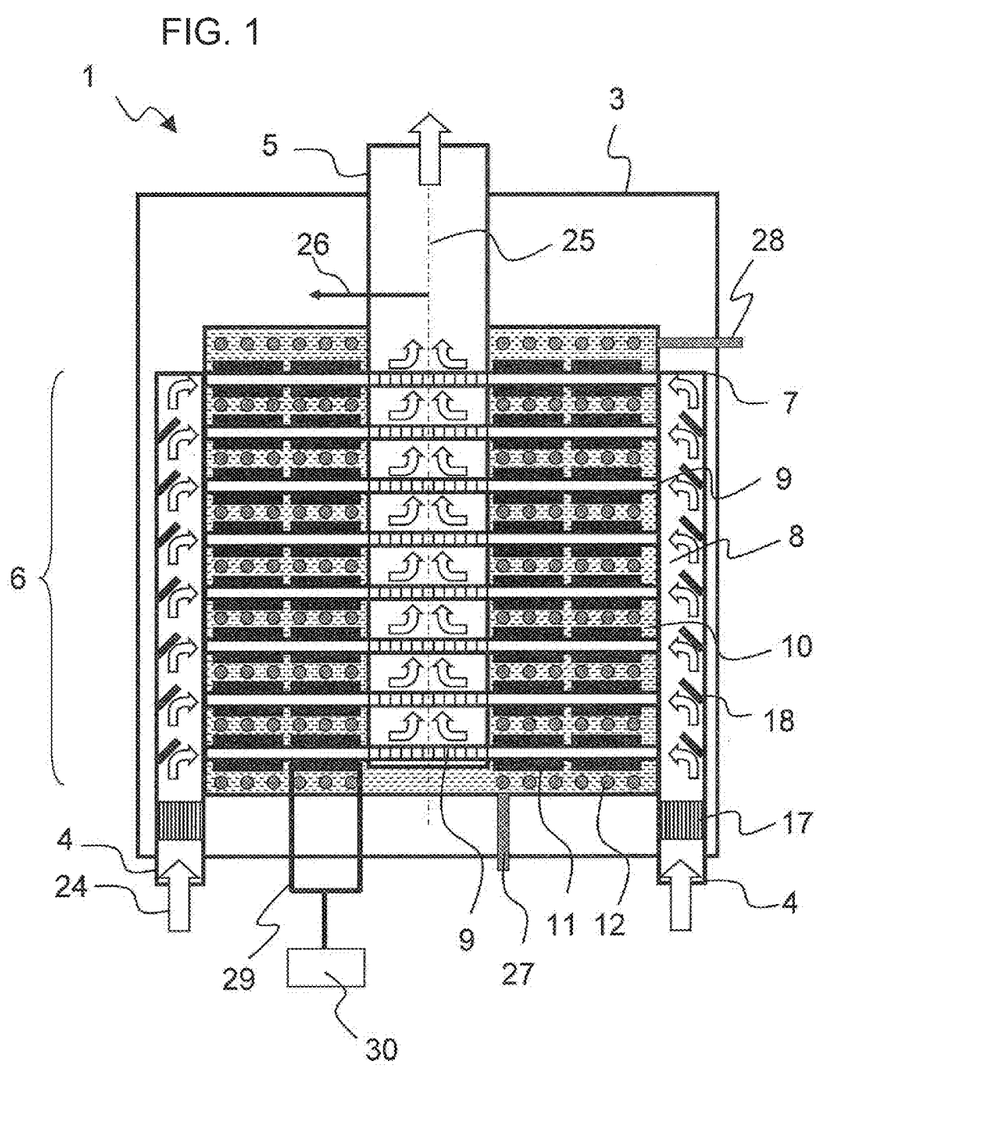
FIG. 1 is a diagrammatic, longitudinal-sectional view of a first variant of a device according to the invention.
Figure 6:
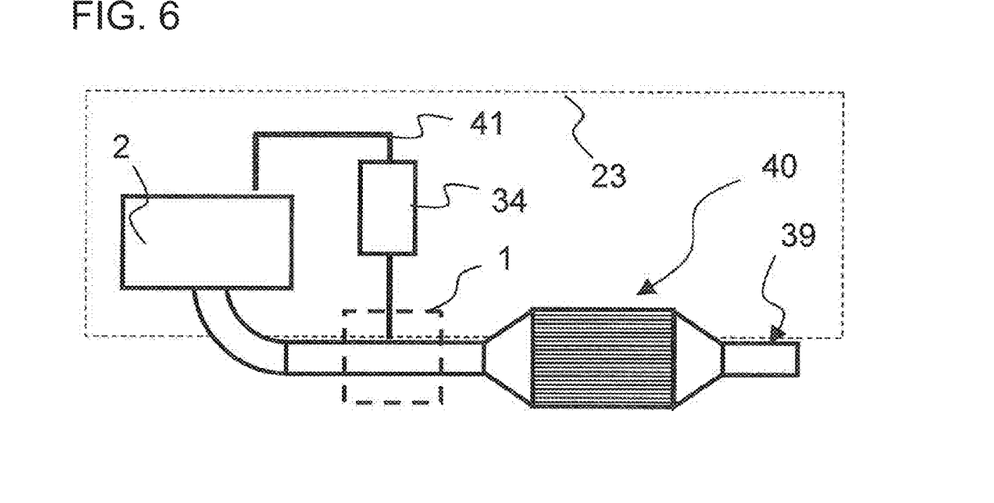
FIG. 6 is a plan view of a motor vehicle showing the integration of the device according to the invention therein.

Referring now in detail to the figures of the drawings, which show especially preferred structural variants to which the invention is not limited, and first, particularly, to FIG. 1 thereof, there is seen a first structural variant of a device 1 according to the invention for producing electrical energy from the exhaust gas of an internal combustion engine 2 illustrated in FIG. 6. A lower area of the device 1 in this case includes a type of annular channel, which forms an exhaust gas inlet connection 4. As is illustrated by arrows, all of the exhaust gas there flows into a generator 3 in a corresponding direction of flow 24. The exhaust gas then first encounters a catalytic converter section 17, which is formed with a so-called honeycomb body, for example, in which a catalytically active coating is provided. After passing through this catalytic converter section 17, the exhaust gas enters a heat exchange section 6, in which it flows radially inwards at an angle of 90° due to a multiplicity of baffle structures provided in the exhaust gas inlet connection 4. In so doing, the exhaust gas is diverted into a multiplicity of flow paths 9, so that a flow diversion 7 or flow division 8 is achieved on a circumferential or jacket surface. The exhaust gas then flows radially inwards to a centrally disposed outlet connection 5, which in this case is open only on one side (that is at the top). The exhaust gas accordingly then reemerges from the individual flow paths 9 and flows off along a central axis 25.

Multiple heat exchange units 10 are disposed in a radial direction 26 around the axis 25 and the exhaust gas outlet connection 5. The heat exchange units 10 centrally enclose a cooling device 12, through which a preferably liquid coolant flows, in order to achieve a maximum possible temperature difference between the cooling device 12 on one hand and the flow paths 9 of the flowing exhaust gas on the other. Each heat exchange unit 10 preferably includes a separate inlet 27 and outlet 28 for the coolant, although this is not absolutely necessary. Thermoelectric elements 11 are provided between the flow paths 9 and the cooling device 12. In this case, there are multiple elements 11 in series, but again this is not necessary. The flow through the channels 9 creates a temperature difference, which results in a generation of thermoelectric energy in the thermoelectric elements 11, which in this case are connected by schematically indicated current paths 29 to a storage battery 30.

Figure 2:
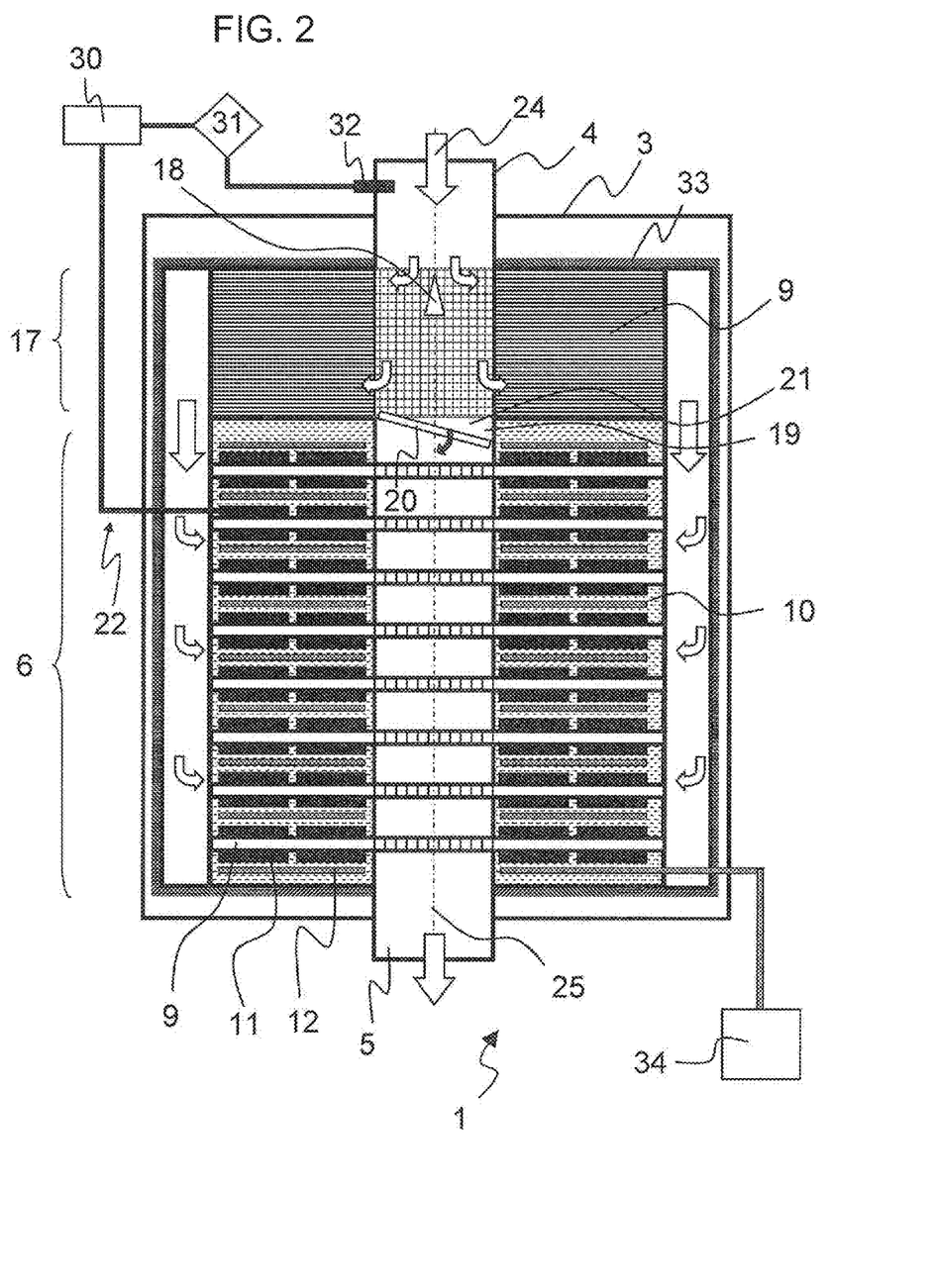
FIG. 2 is a view similar to FIG. 1 of a further structural variant of the device according to the invention.

FIG. 2 shows a somewhat different concept for such a device 1 according to the invention. In this case, the direction of flow 24 is shown flowing substantially from the top downwards. All of the exhaust gas thereby first flows into the exhaust gas inlet connection 4 at the top and into the generator 3. A conical baffle structure 18, which already induces a part of the exhaust gas flow to flow radially outwards, is provided centrally in the exhaust gas inlet connection 4 close to the inlet into the generator 3. Further downstream, a flap 20 is provided, which substantially closes the exhaust gas inlet connection 4 for a predefined operating state of the generator 3, so that (virtually) all of the exhaust gas is then diverted radially outwards. In so doing, the exhaust gas then enters the catalytic converter section 17, which is constructed in the manner of a radial honeycomb body, for example, likewise having a plurality of flow paths 9. At least some of the channels are provided with a coating, which gives rise to an exothermic reaction of the exhaust gas, so that the exhaust gas has a higher thermal energy upon leaving the catalytic converter section 17. The exhaust gas in FIG. 2 then flows further downwards in the annular channel and is again diverted due to the closure, this time radially inwards into the channels 9. In order to ensure that a large proportion of the thermal energy is delivered to the heat exchange units 10, the generator 3 is provided with a thermal insulation 33.

The channels 9 carrying the exhaust gas each have a heat exchange unit 10 on both sides in the area of the heat exchange section 6. These units 10 are generally constructed in such a way that a cooling device 12 is provided internally and the thermoelectric elements 11 are in direct proximity to the flow paths 9. The thermoelectric elements 11 in this case are captively or undetachably connected and, in particular, fixed by a cohesive material connection or joint to the heat exchange units 10. After flowing through these heat exchange units 10, the exhaust gas reemerges into the exhaust gas outlet connection 5 and flows (downwards in FIG. 2) out of the generator 3.

In FIG. 2, a separate auxiliary cooling 22 is also shown at the top on the left. For this purpose, the composition and/or the temperature of the exhaust gas is measured, for example through the use of a sensor 32 disposed in the exhaust gas inlet connection 4, and fed to a control unit 31. If the control unit 31 detects that operation of the generator 3 is no longer possible, because the temperature is too high, for example, and there is therefore a risk of damage to the thermoelectric elements 11, the control unit 31 can also cause the energy to be fed from the storage battery 30 to the thermoelectric elements 11, so that they bring about a cooling in the manner of a Peltier element and therefore safeguard themselves. Such an auxiliary cooling 22 can come into play very rapidly. For this purpose, further sensors 32 may, if necessary, also be provided, particularly on the heat exchange units 10.

A further special detail will also be explained in connection with the flap 20. The flap 20 is positioned at an inlet 21 with a flow connection 19 between the exhaust gas inlet connection 4 and the oppositely-disposed exhaust gas outlet connection 5. The flap 20 is pivoted, as is indicated by the black arrow. Due to a spring force, the flap 20 is most preferably oriented substantially perpendicularly to the direction of flow 24. If the exhaust gas flow then reaches a specific pressure, however, the flow connection 19 is opened by (automatically) pivoting the flap 20. As a result, the heat exchange section 6 is bypassed, thereby, in particular, affording an overload safeguard.

An additional detail further contributing to the simple construction of the device 1 is illustrated at the bottom right of FIG. 2. Thus, for example, a cooler 34 of an exhaust gas recirculation system may also be used to provide the cooling device 12. In particular, a combined system including a cooler 34 of an exhaust gas recirculation line of an exhaust system 39 (shown in FIG. 6) and the thermoelectric generator 3 is therefore proposed in this case.

Figure 3:
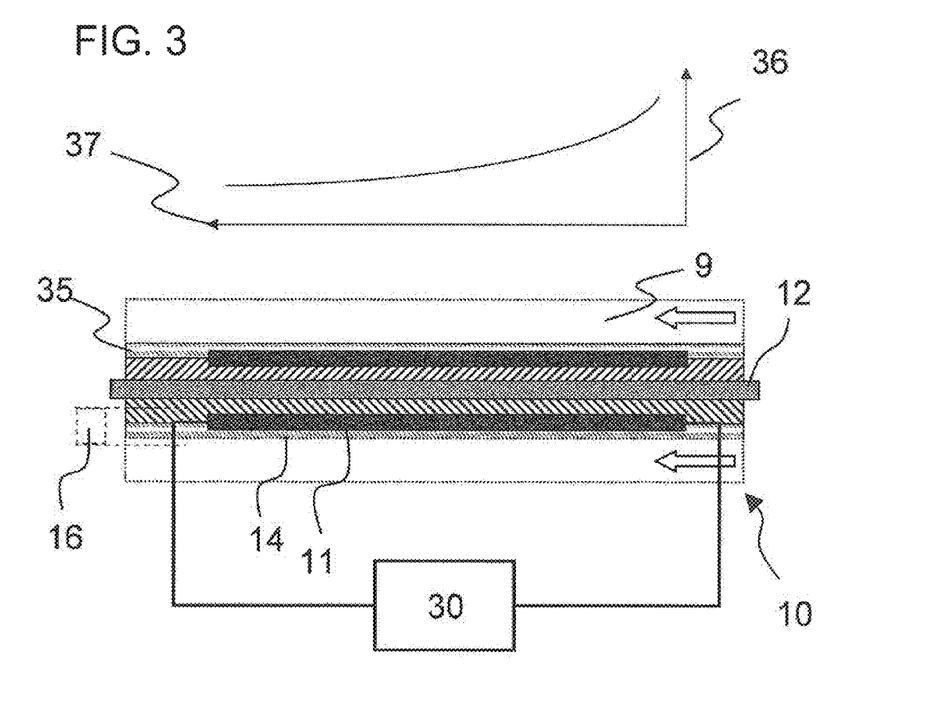
FIG. 3 is a fragmentary, sectional view of a heat exchange unit according to a further structural variant of the invention.

FIG. 3 diagrammatically illustrates the construction of a heat exchange unit 10. The heat exchange unit 10 is positioned adjacent flow paths 9 disposed on both sides, through which hot exhaust gas flows. The heat exchange unit 10 again includes an internal cooling device 12, with a thermoelectric element 11 being provided between the cooling device 12 and each of the flow paths 9. A coating 14, which nonetheless has a high thermal conductivity, is provided in this case for the captive connection of the thermoelectric element 11 and the cooling device 12. A diagram, which illustrates a temperature 36 of the exhaust gas over a length 37 of the flow path 9 and of the thermoelectric element 11, is furthermore shown at the top of FIG. 3 by way of explanation. The temperature opposite the thermoelectric element 11 is significantly lower due to the coolant. This leads to the so-called Seebeck effect, so that current, which is fed to a storage battery 30, can be tapped from the thermoelectric element 11. A protective layer 35, which covers the thermoelectric elements 11, is provided in this case, particularly in order to prevent direct contact of the thermoelectric element 11 (or semiconductor elements) with the exhaust gas.

Should components forming the channels 9 have a different thermal expansion behavior from the heat exchange unit 10 or the cooling device 12, compensators 16 may be provided to compensate therefor. They serve, in particular, to prevent the channels 9 from being deformed and/or to prevent the contiguous contact between the flow paths 9 and the thermoelectric elements 11 from being significantly impaired.

Figure 4:
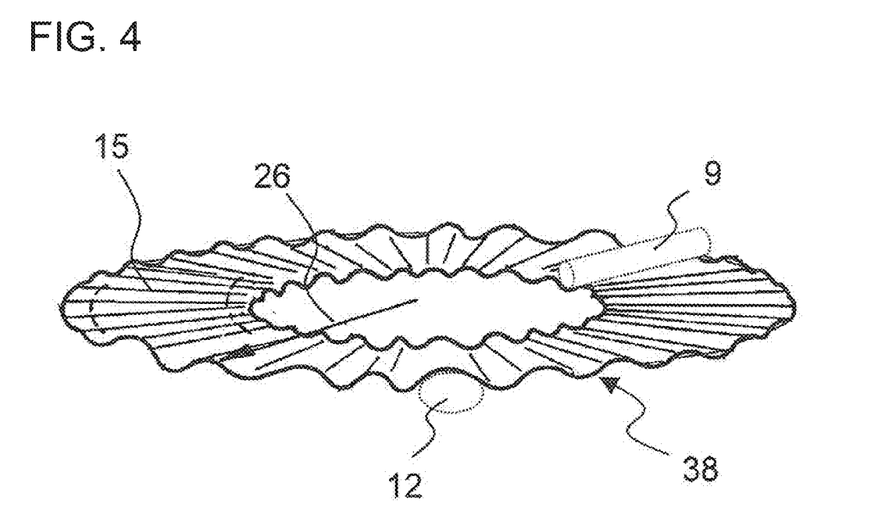
FIG. 4 is a perspective view of an example of a metal foil for the construction of a heat exchange section.

FIG. 4 shows a metal foil 15 which can be used, in particular, to define the channels 9 for the exhaust gas and/or the channels for the cooling device 12. This metal foil 15 has a structure 38, which has elevations and depressions alternating with one another in the circumferential direction of the metal foil, so that channels are formed running in the direction of the radius 26. The channels may also run spirally, so that elevations and depressions occur alternating with one another in the direction of the radius 26. The channels 9 and the cooling device 12 between them can be formed by stacking a plurality of such metal foils 15 on top of one another.

Figure 5:
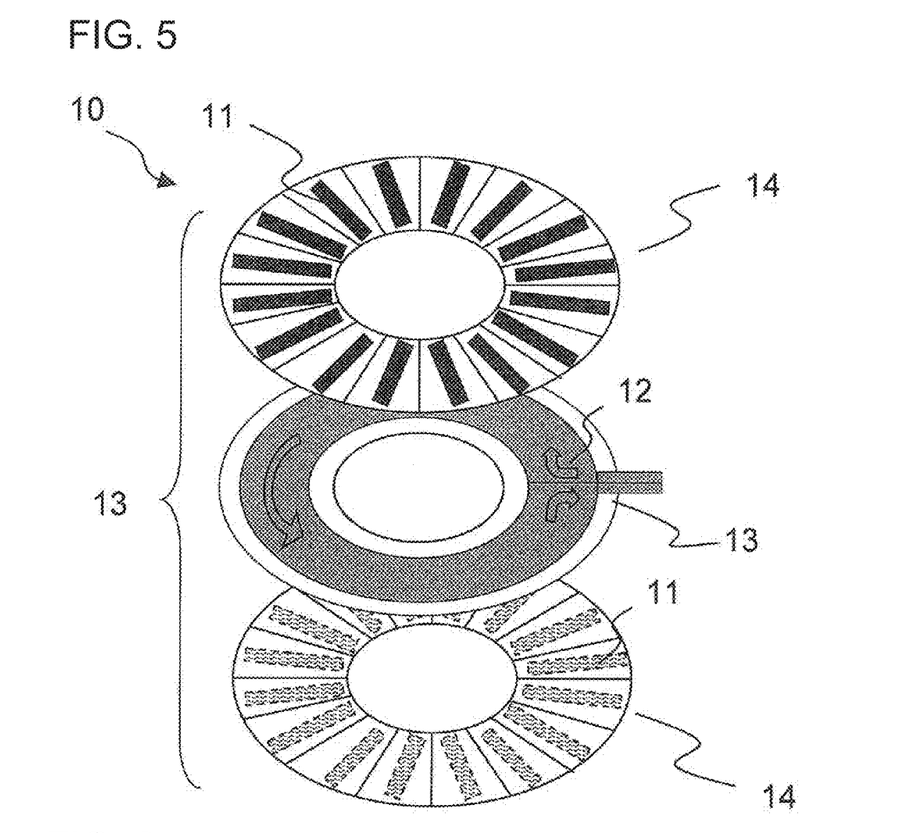
FIG. 5 is an exploded, perspective view of a possible construction for a heat exchange unit.

FIG. 5 is a diagrammatic and exploded representation of a possible construction of a heat exchange unit 10. This unit 10 includes an upper side 14, which is also represented at the top in FIG. 5. There, a radial configuration of the thermoelectric elements 11, for example, is achieved, particularly with a similar orientation of the channels 9. At the same time, the heat exchange unit 10 includes a central plate element 13, in which a cooling device 12 is formed. The coolant flows in towards the cooling device 12, runs around the plate element 13 in a circumferential direction and then flows off again. Other directions of flow and/or flow divisions or diversions of the coolant can nevertheless also be achieved. The thermoelectric elements 11, which are only represented therein by dashed lines, since they are situated on the underside, are in turn disposed on an opposite, lower side 14.

FIG. 6 schematically illustrates a preferred application of such a device 1. It shows a motor vehicle 23 having the internal combustion engine 2. Exhaust gas produced in the internal combustion engine 2, for example a spark-ignition engine or a diesel engine, then flows on into the exhaust system 39. In this case, the device 1 according to the invention is advantageously connected directly to the internal combustion engine 2 on the outlet side. It may be part of the exhaust system 39 itself, but where necessary it may be part of an exhaust gas recirculation system 41, in which particularly advantageous use can be made of the cooler 34. After treatment by the thermoelectric generator 3, the exhaust gas may still be fed to an exhaust treatment unit 40, before being led off to the surroundings, duly treated.

Figure 7:
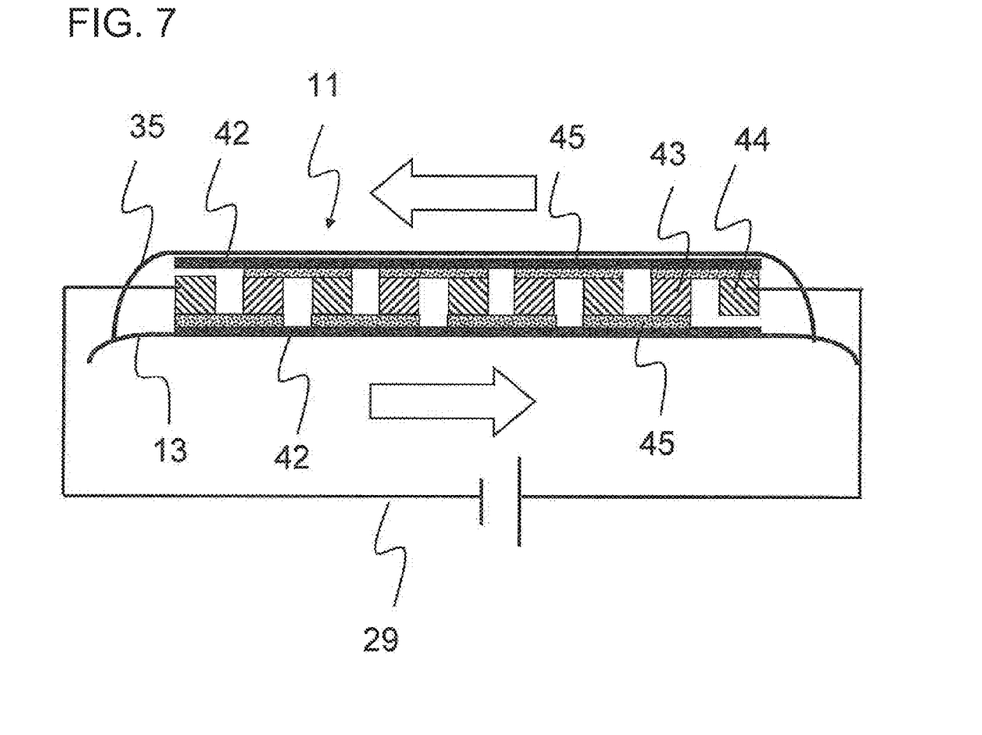
FIG. 7 is a fragmentary, sectional view through an upper part of a cooing device with a thermoelectric element of a further embodiment of the invention.

FIG. 7 illustrates a further embodiment of the invention as a section through a structural variant of the upper part of the cooling device with the thermoelectric element 11. It should be pointed out, merely for the sake of completeness, that multiple thermoelectric elements 11, which are connected electrically in parallel and/or in series, are (generally) provided in a cooling device 12. A thermoelectric element 11 in this case is disposed gas-tightly between a protective layer 35 and a plate element 13 of the cooling device 12 and is connected by a cohesive material connection or joint to the plate element 13. The thermoelectric element 11 includes multiple paired configurations of different semiconductor blocks (p-type semiconductor blocks 44 and n-type semiconductor blocks 43), which are alternately connected on their upper and lower sides to metallic, electrically conductive bridges 45. The bridges 45 are mounted on ceramic plates 42, so that a directional current flow is ensured through the bridges 45. If hot exhaust gas then flows past the protective layer 35, that side heats up, while the opposite side is cooled by the coolant. Thermal energy can now be effectively converted into electrical energy according to the Seebeck effect.

Figure 8:
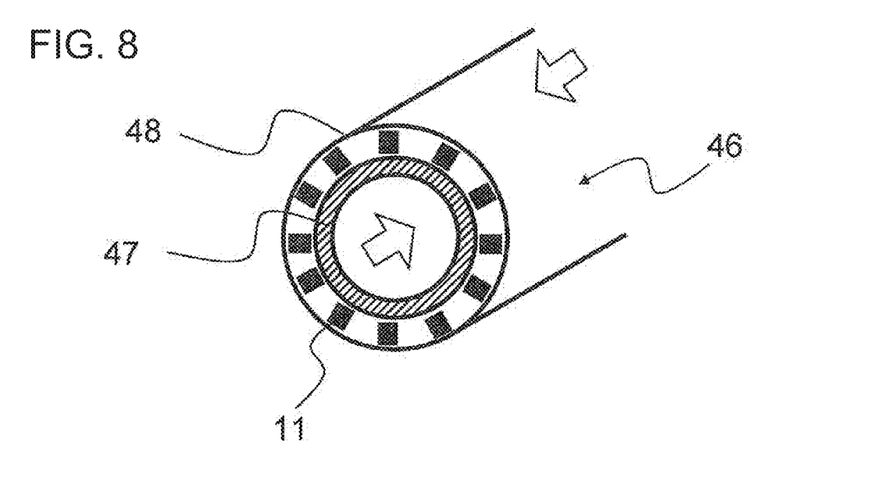
FIG. 8 is a fragmentary, perspective view of a structural variant of a heat exchange unit having a tubular element.

FIG. 8 illustrates another structural variant of a heat exchange unit, which is constructed with multiple tubular elements 46. In this case, multiple thermoelectric elements 11 are provided both over the circumference and in an axial direction of each tubular element 46 and are captively disposed on a tube wall 47. The thermoelectric elements 11 are outwardly enclosed by a protective layer 48, which in particular serves to prevent any contact of the thermoelectric elements 11 with the exhaust gas. With regard to the construction, the electrical connections, the flow ducting or channeling and the materials etc., reference may be made to the details explained in connection with the other embodiments of the heat exchange unit.

The invention claimed is:

1. A device for producing electrical energy from the exhaust gas of an internal combustion engine, the device comprising:
   a generator having an exhaust gas inlet connection, an exhaust gas outlet connection and at least one heat exchange section between said exhaust gas inlet and outlet connections;
   said heat exchange section including multiple heat exchange units and a plurality of radial flow paths transverse to said exhaust gas inlet connection and configured to be assigned to said multiple heat exchange units, at least some of said multiple heat exchange units having at least one radially configured thermoelectric element and a cooling device, said at least one thermoelectric element being captively connected to said cooling device.

2. The device according to claim 1, wherein said exhaust gas inlet connection and said exhaust gas outlet connection are disposed opposite one another and said multiple heat exchange units are disposed radially of said exhaust gas inlet and outlet connections.

3. The device according to claim 1, which further comprises compensators disposed in said at least one heat exchange section for relative movements of said at least one heat exchange unit.

4. The device according to claim 1, wherein said generator has a catalytic converter section disposed at least partially upstream of said at least one heat exchange section.

5. The device according to claim 1, which further comprises an auxiliary cooling device for at least a part of said at least one heat exchange section.

6. A motor vehicle, comprising a device according to claim 1.

7. The device according to claim 1, wherein said generator has an axial direction, said exhaust gas inlet connection guides the exhaust gas in said axial direction, and said radial flow paths divert the exhaust gas from said axial direction.

8. The device according to claim 1, which further comprises at least one flow diversion and/or at least one flow division between said exhaust gas inlet connection and said at least one heat exchange section.

9. The device according to claim 8, wherein said at least one flow diversion is a baffle structure positioned in said exhaust gas inlet connection.

10. The device according to claim 1, wherein said multiple heat exchange units and said cooling device are formed with at least one of plate elements or tubular elements on which said at least one thermoelectric element is disposed.

11. The device according to claim 10, wherein said cooling device is disposed within said plate element, said flow paths of said at least one heat exchange section are adjacent flow paths, and said at least one thermoelectric element includes two thermoelectric elements each disposed at a respective side of said plate element facing said adjacent flow paths.

12. The device according to claim 10, wherein said plate elements are formed of a metal foil including at least one thermoelectric element covered by a protective layer.

13. The device according to claim 1, which further comprises at least one adjustable flow connection disposed between said exhaust gas inlet connection and said exhaust gas outlet connection, for permitting exhaust gas to flow past at least a part of said at least one heat exchange section.

14. The device according to claim 13, wherein said at least one adjustable flow connection includes a spring-loaded and pivoted flap at an inlet of said at least one flow connection.

* * * * *